United States Patent [19]
Miyamoto et al.

[11] Patent Number: 5,962,084
[45] Date of Patent: Oct. 5, 1999

[54] PLASMA CVD PROCESS AND SEMICONDUCTOR DEVICE HAVING METAL FILM FORMED BY THE PROCESS

[75] Inventors: Takaaki Miyamoto; Shingo Kadomura; Atsushi Kawashima, all of Kanagawa, Japan

[73] Assignee: Sony Corporation, Tokyo, Japan

[21] Appl. No.: 08/770,819

[22] Filed: Dec. 20, 1996

[30] Foreign Application Priority Data

Dec. 25, 1995 [JP] Japan ................ P07-336309

[51] Int. Cl.$^6$ ...................................... H05H 1/29
[52] U.S. Cl. .................. 427/576; 427/569; 427/8; 438/680; 428/689; 428/450
[58] Field of Search ..................... 427/563, 455, 427/562, 572, 534, 574, 564, 576, 8, 10, 535, 537, 569; 438/680, 685; 428/689, 450

[56] References Cited

U.S. PATENT DOCUMENTS

| | | | |
|---|---|---|---|
| 4,460,673 | 7/1984 | Sukigara et al. | 430/128 |
| 4,492,620 | 1/1985 | Matsu et al. | 204/192 |
| 5,177,589 | 1/1993 | Kobayashi et al. | 257/773 |
| 5,180,435 | 1/1993 | Markunas et al. | 118/723 |
| 5,246,881 | 9/1993 | Sandu et al. | 437/192 |
| 5,514,425 | 5/1996 | Ito et al. | 427/534 |
| 5,571,571 | 11/1996 | Musaka et al. | 427/574 |
| 5,620,925 | 4/1997 | Nakata et al. | 438/641 |
| 5,803,974 | 5/1998 | Miyamato | 438/685 |
| 5,840,628 | 11/1998 | Miyamato | 438/680 |

*Primary Examiner*—Deborah Jones
*Assistant Examiner*—Stephen Stein
*Attorney, Agent, or Firm*—Ronald P. Kananen; Rader, Fishman & Grauer

[57] ABSTRACT

A plasma CVD process of forming a metal film containing a residual halogen element in a small amount and a high reliability semiconductor device fabricated by the process. The plasma CVD process includes the step of forming a metal film on a substrate to be processed, using a mixed gas containing a metal halide and hydrogen, wherein the plasma CVD process adopts a plasma CVD condition which is determined in such a manner that emission spectrum intensities of a plasma of the mixed gas are measured; and a mixing ratio of the metal halide in the mixed gas is set to be not more than a value at which a decreasing rate, depending on mixing of the metal halide, of an emission spectrum intensity of a hydrogen spectral line is rapidly changed and also at which an increasing ratio, depending on mixing of the metal halide, of an emission spectrum intensity of a halogen element is rapidly changed.

13 Claims, 13 Drawing Sheets

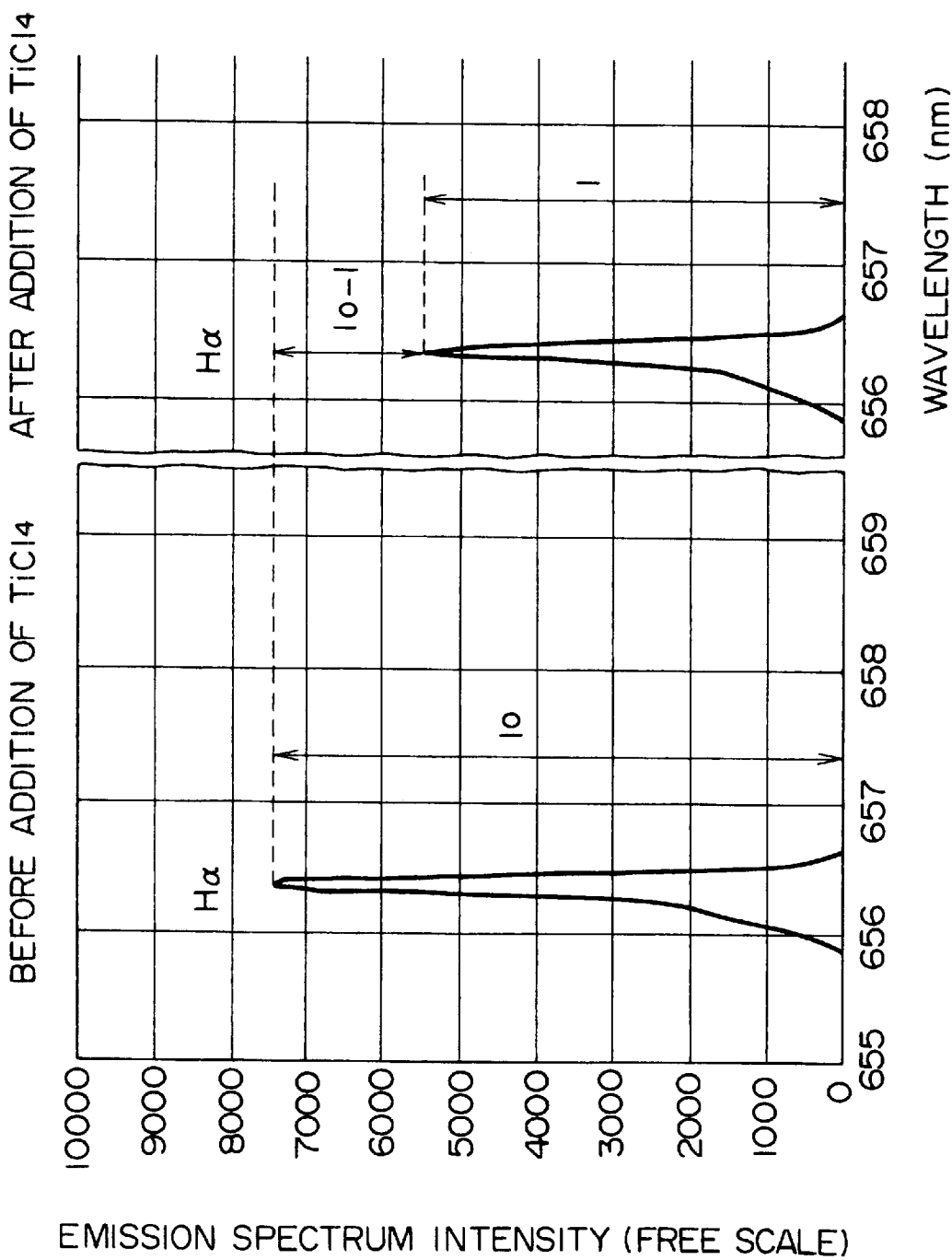

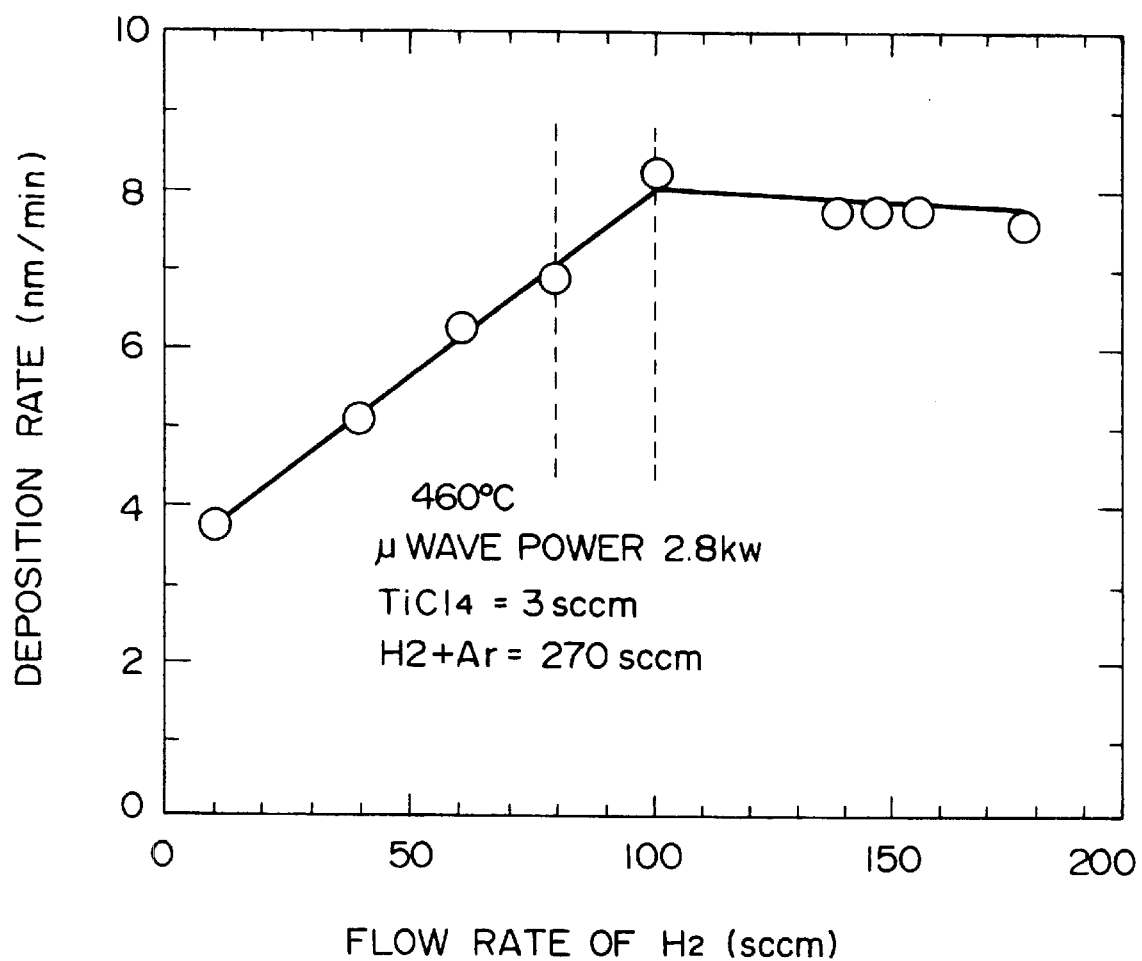

PLASMA CVD PROCESS AND SEMICONDUCTOR DEVICE HAVING METAL FILM FORMED BY THE PROCESS

BACKGROUND OF THE INVENTION

The present invention relates to a plasma CVD process used for fabrication of semiconductor devices and to a semiconductor device fabricated by the process, and particularly to a plasma CVD process capable of forming a metal film containing a residual halogen element in a small amount and to a high reliability semiconductor device fabricated by the process.

With the tendency toward increasing density in the design rule of semiconductor devices such as LSIs from a half-micron level to a quarter-micron level or less and also toward adoption of a multi-layered interconnection structure, the aspect ratio of a contact hole for connecting interconnection layers to each other needs to be increased. For example, for a semiconductor device having a 0.18 μm rule, the diameter of a contact hole is 0.2 μm and the thickness of an interlayer insulating film is about 1.0 μm, Consequently, the aspect ratio of the contact hole is 5. A process for achieving a multi-layered interconnection structure with a high reliability through such a fine contact hole having such a high aspect ratio has been developed. A a Ti metal layer for ohmic contact and a TiN layer as a barrier metal for preventing diffusion of an interconnection material are thinly formed on the inner surface of the contact hole in a conformal manner. Then the contact hole is filled with an upper interconnection material or a contact plug by high temperature sputtering of an Al based metal material, or selective CVD or blanket CVD of tungsten.

In general, a Ti metal layer or a TiN layer is formed by sputtering or reactive sputtering using a bulk Ti metal as a target. In particular, there has been proposed, in Japanese Patent Laid-open No. Hei 6-140359, a collimated sputtering process in which vertical incident components of sputtering particles are made larger or a long-distance sputtering process in which a target distance is increased It has been reported that these sputtering processes are effective to reduce the contact resistance and improve the barrier performance as compared with the ordinary sputtering process. However, these sputtering processes having a feature in which vertical incident components of sputtering particles toward a substrate to be processed are made larger, have a problem that the thickness of a shoulder portion or a side surface of a fine contact hole having a large aspect ratio inevitably becomes extremely thin. When such a contact hole is subjected to blanket CVD of W or the like in the subsequent step, there arises an inconvenience in that a source gas WF$_6$ permeates through the thin portion of the film, leading to abnormal growth of W or separation of the Ti metal layer or the TiN layer.

To cope with the above problem regarding step coverage which has been not solved by these sputtering processes including the collimated sputtering, there has been proposed a method of forming a Ti metal layer and a TiN layer in a conformal manner by a CVD process making use of a chemical reaction on the surface of a substrate to be processed.

The CVD processes for forming a Ti based material layer by making use of a chemical reaction, that have been proposed up to now are generally classified into two groups: one being a type of process using an inorganic metal halide such as TiCl$_4$, which has been reported for example in "Abstract of the 44-th Symposium of Semiconductor/ Integrated Circuit Technology Institute, pp. 31 (1993)"; and the other being a type of process using an organic metal compound such as TDMAT or TDEAT, which has been reported for example in "Proc. 11th. Int. IEEE VMIC, pp. 440 (1994)".

In the latter type using an organic metal source gas, generally, a Ti metal layer is formed by sputtering and then a TiN layer is formed by MOCVD.

On the other hand, the former type using an inorganic source gas is advantageous in that a Ti metal layer is formed by a reduction reaction by H$_2$ in a CVD system and a TiN layer is continuously formed in the same CVD system using the same gas added with N$_2$.

Incidentally, a reduction reaction of TiCl$_4$ as a metal halide using hydrogen molecules is an endothermic reaction expressed by

where ΔG indicates a standard heat of formation.

This reduction reaction is thermodynamically slow.

A method of accelerating this reduction reaction of TiCl$_4$ has been proposed, in which hydrogen atoms and hydrogen radicals produced by dissociation of hydrogen in a plasma are used in a reduction reaction for formation of a Ti layer by plasma CVD. Such a reaction is an exothermic reaction expressed by

This reduction reaction of TiCl$_4$, which is higher at reaction speed, makes it possible to form a Ti metal layer by plasma CVD at a relatively low temperature. In addition, a plasma CVD process using a high density plasma source, for example, an ECR-CVD process, inductively coupled plasma CVD process or a helicon wave plasma CVD process is advantageous in film formation rate and film uniformity.

However, the above plasma CVD process for forming a Ti metal layer using a reduction reaction of TiCl$_4$ by hydrogen atoms and hydrogen radicals has the following two problems.

The first problem is that in some film formation conditions, TiCi$_4$ is not sufficiently reduced by hydrogen atoms and hydrogen radicals even by plasma CVD using a high density plasma. Consequently, the Ti metal layer is not uniformly formed. In this case, a underlying conductive material, for example, a silicon substrate, is etched in accordance with the following equation:

This problem will be described in detail with reference to FIG. 6.

FIG. 6 is a schematic sectional view illustrating a problem occurring in the case where a Ti metal layer is formed by plasma CVD in a contact hole 3 formed in an interlayer insulating film 2 on a Si substrate 1. In this case, when TiCl$_4$ is not sufficiently reduced by hydrogen atoms and hydrogen radicals, the Si substrate 1 is etched in accordance with the equation (3), to produced a corrosion portion 6. The production of such a corrosion portion 6 will break a shallow diffusion layer (not shown) in a surface portion of the Si substrate 1, leading to a serious defect of increasing leak current. In addition, a Ti metal layer is formed but is not shown in FIG. 6.

Moreover, when the reduction of $TiCl_4$ by hydrogen atoms and hydrogen radicals is imperfect, an intermediate product TiClx (x is an integer less than 4) or chlorine atoms are entrapped in the Ti metal layer during formation thereof, thereby increasing the residual amount of chlorine in the Ti metal layer. As a result, an Al based layer formed in the subsequent step is possibly corroded, leading to the increased contact resistance, and to disconnection in the worst case.

The second problem is that in some film formation conditions, a Ti metal film is not uniformly grown, that is, particles of Ti metal are non-uniformly grown even by plasma CVD using a high density plasma source.

This problem will be described in detail with reference to FIGS. 13A and 13B.

FIGS. 13A and 13B are schematic sectional views illustrating a problem occurring in the case where a Ti metal film 4 is formed by plasma CVD in a contact hole 3 formed in an interlayer insulating film 2 on a semiconducting substrate 1 made from Si or the like. When $TiCl_4$ is not sufficiently reduced by hydrogen atoms and hydrogen radicals, the surface morphology of the Ti metal film 4 is degraded due to non-uniform growth of particles of Ti metal, as shown in FIG. 13A.

Thus, in the case where a TiN film 6 is formed on the Ti metal film 4 having such a poor surface morphology, since the TiN film 6 is grown while following the surface shape of the underlying Ti metal film 4 as shown in FIG. 13B, it is formed in the shape of particles and is prevented from being grown at portions where adjacent particles of TiN are brought in contact with each other. In particular, a large gap 7 is possibly produced at a corner of a bottom portion of the contact hole 3.

When a layer of a high melting point metal such as W is formed on the bottom portion of the contact hole 3 having such a gap 7 by CVD using a source gas $WF_6$, the source gas corrodes the underlying semiconducting substrate 1 by way of the gap 7, to break a shallow diffusion layer (not shown) in a surface portion of the substrate 1. Also, in the case where the contact hole 3 is embedded with an Al based metal, the Al based metal passes through the gap 7, and reacts with the semiconducting substrate 1 made of Si or the like, to thereby cause an alloy spike or the like. In each case, there arises serious defects such as the increased leak current in connection between layers.

Moreover, when the reduction of $TiCl_4$ by hydrogen atoms and hydrogen radicals is imperfect, a precursor TiClx (x is an integer less than 4) or chlorine atoms are entrapped in the Ti metal layer during formation thereof, to increase the residual amount of chlorine in the Ti metal layer. As a result, an Al based layer formed in the subsequent step is possibly corroded, leading to the increased contact resistance, and to disconnection in the worst case.

SUMMARY OF THE INVENTION

A first object of the present invention is to provide a highly reliable plasma CVD process of forming a metal film made from Ti or the like using a source gas containing a metal halide such as $TiCl_4$ and hydrogen, wherein the residual amount of a halogen element such as chlorine in the metal film is small and an underlying conductive layer is not corroded; and to provide a semiconductor device having high reliability and high integration in which a metal film formed by the above plasma CVD process is used as an electrode or an interconnection layer.

A second object of the present invention is to provide a highly reliable plasma CVD process of forming a metal film made from Ti or the like using a source gas containing a metal halide such as $TiCl_4$ and hydrogen, in which the surface of the metal film is made smooth, the residual amount of a halogen element such as chlorine in the metal film is small, and an underlying material layer and an interconnection material layer are prevented from being eroded or corroded; and to provide a semiconductor device with a high reliability and high integration, in which a metal film formed by the above plasma CVD process is partially used as an electrode and an interconnection layer.

To achieve the first object, according to a first aspect of the present invention, there is provided a plasma CVD process including the step of forming a metal film on a substrate to be processed using a mixed gas containing a metal halide and hydrogen, wherein the plasma CVD process adopts a plasma CVD condition which is determined in such a manner that the emission spectrum intensities of a plasma of the mixed gas are measured; and a mixing ratio of the metal halide in the mixed gas is set to be no more than a value at which a decreasing rate, depending on mixing of the metal halide, of an emission spectrum intensity of a hydrogen spectral line is rapidly changed and also at which an increasing ratio, depending on mixing of the metal halide, of an emission spectrum intensity of a halogen element is rapidly changed.

In the above plasma CVD process, the emission spectrum intensity of a hydrogen spectral line is preferably at least any one of emission spectrum intensities of hydrogen spectral lines $H_\beta$, $H_\gamma$, and $H_\delta$.

According to a second aspect of the present invention, there is provided a plasma CVD process including the step of forming a metal film on a substrate to be processed, using a mixed gas containing a metal halide and hydrogen, wherein the plasma CVD process adopts a plasma CVD condition which is determined in such a manner that a mixing ratio of hydrogen in the mixed gas is set to be not less than a value at which a decreasing ratio D, depending on mixing of the metal halide, of an emission spectrum intensity of a hydrogen spectral line is rapidly changed, the decreasing ratio D being expressed by $$D=(I_0-I)/I_0$$

where Io indicates the emission spectrum intensity of the hydrogen spectral line before addition of the metal halide, and I indicates the emission spectrum intensity of the hydrogen spectral line after addition of the metal halide.

In each of the above plasma CVD processes, the metal film is preferably formed at a substrate temperature which is controlled to be 500° C. or less.

According to a third aspect of the present invention, in addition to the features of the above plasma CVD processes, the metal film formed on the substrate contains halogen atoms in an amount of one atomic % or less.

To achieve the second object, according to a fourth aspect of the present invention, there is provided a plasma CVD process including the step of forming a metal film on a substrate to be processed, using a mixed gas containing a metal halide and hydrogen, wherein a surface of the substrate is uniformly treated with hydrogen radicals, before formation of the metal film.

In the above plasma CVD process, a plasma CVD condition for allowing the surface of the substrate or the surface of the metal film which is being formed on the substrate to be uniformly treated with hydrogen radicals; or for allowing the surface of the metal film which is being formed on the substrate to be uniformly adsorbed or terminated hydrogen radicals is specified as follows:

Namely, the plasma CVD condition adopts a mixing ratio of hydrogen in the mixed gas, which is gradually increased in such a manner as to be not less than a value at which a deposition rate of the metal film is substantially saturated.

The upper limit of the flow rate of hydrogen to the flow rate of a metal halide is not particularly limited; however, if the flow rate of hydrogen is excessively higher, the metal halide is excessively diluted and the deposition rate of a metal film is reduced, and also hydrogen is uneconomically consumed. Accordingly, the flow rate of hydrogen may be set to be about 100 times or less, practically, about 70 times or less the flow rate of a metal halide.

In the above plasma CVD process, the metal film is preferably formed at a substrate temperature which is controlled to be 500° C. or less.

According to a fifth aspect of the present invention, there is provided a semiconductor device having a metal film which is formed on a substrate using the above plasma CVD process.

In addition, specific samples of metal halides used in the present invention may include metal chlorides, metal bromides or metal iodides. Preferably, there are used titanium halides including $TiCl_4$ (mp=−25° C., bp=136° C.), $TiBr_4$ (mp=39° C., bp=230° C.) and $TiI_4$ (mp=150° C., bp=377.1° C.). Of these titanium halides, $TiCl_4$ is most preferable because it is in a liquid stare at room temperature and is easily handled. A material selected from these titanium halides and organic titanium compounds may be introduced into a plasma CVD chamber by a related art burning method or heating bubbling method using a carrier gas.

As a plasma CVD system used for the plasma CVD process of the present invention, a usual parallel plate type plasma CVD system may be used, and more preferably, a plasma CVD system using a high density plasma source, such as, an ECR plasma CVD system, inductively coupled plasma CVD system, or a helicon wave plasma CVD system may be used in terms of film formation rate and uniformity of deposition.

Emission spectral lines of hydrogen atoms in the present invention are exemplified by $H_\alpha$ (656.3 nm), $H_\beta$ (486.1 mn), $H_\gamma$ (434.0 nm) and $H_\delta$ (410.2 nm) in a Balmer series. In the first aspect of the present invention, at least any one of spectrum intensities of these hydrogen spectral lines $H_\beta$, $H_\gamma$ and $H_\delta$ is used.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 5 is a diagram showing a change in emission spectrum intensity of the spectral line $H_\alpha$ before and after addition of $TiCl_4$ in the plasma CVD process using a mixed gas of $TiCl_4$ and hydrogen as the first embodiment of the present invention;

FIG. 8 is a graph showing a relationship between a flow rate of hydrogen in a mixed gas and a deposition rate of a metal film in Example 2 according to the second embodiment of the present invention;

DETAILED DESCRIPTION OF THE PREFERRED EMBODIMENTS

Figure 1A:
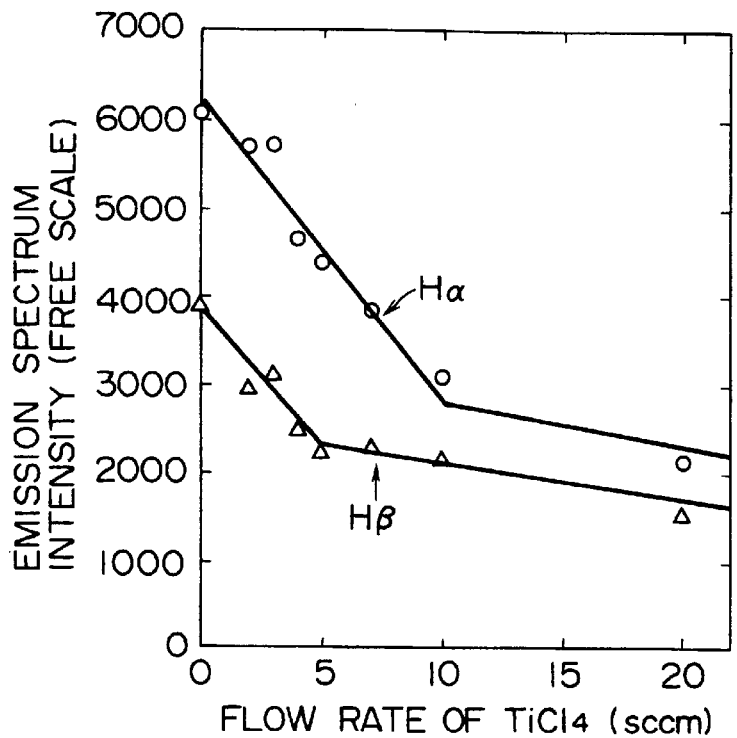
FIG. 1A and 1B are graphs showing relationships between flow rates of $TiCl_4$ and emission spectrum intensities of hydrogen atoms and chlorine in a plasma in a plasma CVD process as a first embodiment of the present invention.

Hereinafter, preferred embodiments of the present invention will be described in detail with reference to the drawings.

Embodiment 1

First and second features of this embodiment are to provide a plasma CVD process of forming a metal film by plasma CVD in such a plasma CVD condition that the mixing ratio of a mixed gas containing a metal halide and hydrogen is optimized, thereby sufficiently accelerating a reduction reaction of the metal halide, preventing corrosion of an underlying conductive material layer such as a silicon substrate, and reducing the content of a halogen element in the metal film.

A third feature of this embodiment is to provide a high reliability semiconductor device, in which a metal film containing a halogen element in a small amount, formed by the above plasma CVD process, is used as an electrode/interconnection material, thereby preventing corrosion of an Al interconnection layer formed in a subsequent step.

The above-described features of this embodiment will be further described in detail.

The first feature of this embodiment will be described. As a mixing ratio of a metal halide in a mixed gas containing the metal halide and hydrogen as a source gas for plasma CVD is gradually increased with a flow rate of hydrogen kept constant, an emission spectrum intensity of a hydrogen spectral line in a plasma is gradually decreased because hydrogen atoms and hydrogen radicals are consumed for reduction reaction of the metal halide. The decreasing rate of the emission spectrum intensity of the hydrogen spectral line is rapidly changed when the mixing ratio of the metal halide becomes a certain value or more. When the mixing ratio of the metal halide is less than the turning point, hydrogen atoms and hydrogen radicals are sufficiently present in the plasma, with a result that the reduction reaction of the metal halide fully proceeds. On the contrary, when the mixing ratio of the metal halide is more than the turning point, hydrogen atoms and hydrogen radicals are lacking in the plasma, with a result that the reduction reaction of the metal halide does not fully proceed.

From the standpoint of the emission spectrum intensity of a halogen element in a plasma, when the mixing ratio of the metal halide is less than the turning point, the metal halide is immediately reduced and thereby halogen radicals are present in the plasma in a small amount, with a result that the reduction reaction of the metal halide fully proceeds. On the other hand, when the mixing ratio of the metal halide is more than the turning point, halogen radicals are excessively present in the plasma, with a result that the reduction reaction of the metal halide does not fully proceed.

Accordingly, a plasma CVD condition for ensuring a desirable reduction reaction of a metal halide can be specified by monitoring the above-described turning point at which the emission spectrum intensities of a hydrogen spectral line and of a halogen element in a plasma are rapidly changed.

Next, the second feature of this embodiment will be described in detail. As a metal halide is mixed with hydrogen constituting a source gas of plasma CVD in a plasma, the emission spectrum intensity of a hydrogen spectral line is decreased at a specified rate. This state will be described with reference to FIG. 5.

FIG. 5 is a graph showing a change in emission spectrum intensity of the spectral line $H_\alpha$ before and after addition of $TiCl_4$ as a metal halide. An emission spectrum intensity $I_0$ of the spectral line $H_\alpha$ before addition of the metal halide is decreased to an emission spectrum intensity I of the spectral line $H_\alpha$ by the addition of the metal halide. Here, a D value expressed by the following equation indicates a decreasing rate of the emission spectrum intensity of the hydrogen spectral line.

$$D=(I_0-I)/I_0$$

In addition, the differential intensity $(I_0-I)$ is equivalent to the amount of hydrogen atoms and hydrogen radicals consumed by mixing of the metal halide.

Accordingly, it can be decided whether or not the reduction reaction of a metal halide fully proceeds by monitoring the turning point at which the D value is rapidly changed. In addition, the D value expressed by the equation is advantageous in that it is not affected by the emission spectrum intensity $I_0$ of the hydrogen spectral line before addition of the metal halide.

With this configuration, it becomes possible to set a plasma CVD condition capable of supplying a sufficient amount of hydrogen to a metal halide, and hence to allow the reduction reaction of a metal halide such as $TiCl_4$ to fully proceed.

By setting a plasma CVD condition to allow the reduction reaction of a metal halide to fully proceed, the residual content of a halogen element in a Ti metal layer can be suppressed at a value of 1% or less even by plasma CVD performed at a substrate temperature controlled to be 500° C. or less. The lowering of the processing temperature enables the plasma CVD process in this embodiment to be applied to formation of a via hole for an interconnection layer not only on a silicon substrate but also on a poly-Si substrate. In addition, it is confirmed that where the residual content of a halogen element in a metal film is 1% or less, the discharged amount of the halogen element in the subsequent step becomes extremely small, with a result that the corrosion of an Al interconnection layer does not occur.

The plasma CVD process in this embodiment will be more clearly understood with reference to the following examples, in which a Ti metal film is formed using a mixed gas of $TiCl_4/H_2/Ar$ by an ECR plasma CVD system.

EXAMPLE 1

In this example, an optimum plasma CVD condition, that is, optimum reduction condition of $TiCl_4$ is specified by monitoring emission spectrum intensities of hydrogen atoms and chlorine in plasma CVD using a mixed gas of $TiCl_4/H_2/Ar$ in which the mixing ratio of $TiCl_4$ is gradually increased with a flow rate of hydrogen kept constant; and a Ti metal film having a smooth surface morphology and containing chlorine in a small amount is formed using such a plasma CVD condition.

An interlayer insulating film (made from $SiO_2$) having a thickness of 1.0 μm is formed on a semiconducting substrate (made from silicon or the like) formed with an impurity diffusion layer in a surface portion and is perforated to form a contact hole having an opening diameter of 0.25 μm. Subsequently, native oxide on the impurity diffusion layer exposed at a bottom portion of the contact hole is removed with diluted hydrofluoric acid solution. The substrate is then placed on a substrate stage in an ECR plasma CVD system, and the bottom portion of the contact hole is first cleaned by plasma processing using a mixed gas of $H_2/Ar$.

A Ti layer is formed in the contact hole of the substrate using a mixed gas of $TiCl_4/H_2/Ar$ in the same ECR plasma CVD system. A plasma CVD condition used in this processing is as follows:

| | |
|---|---|
| $TiCl_4$ | 0–20 sccm (variable) |
| $H_2$ | 100 sccm (constant) |
| Ar | 170 sccm |
| gas pressure | 0.35 Pa |
| microwave power | 2.8 Kw (2.45 GHz) |
| stage temperature | 410° C. |

Figure 1B:
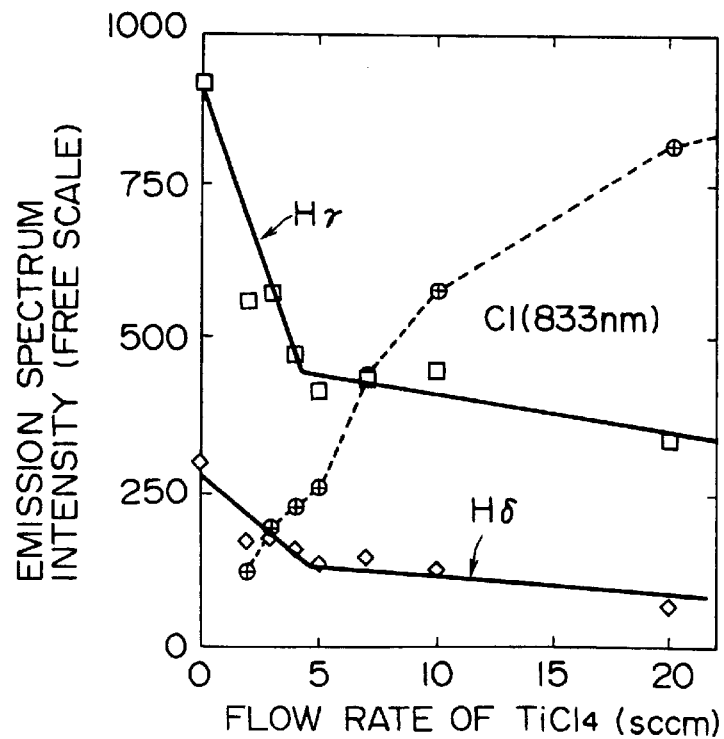

FIGS. 1A and 1B show emission spectrum intensities of hydrogen atoms and chlorine in a plasma produced by plasma CVD using the mixed gas of $TiCl_4/H_2/Ar$ in which the flow rate of $TiCl_4$ is gradually increased from 0 scam to 20 sccm, wherein FIG. 1A shows emission spectrum intensities of hydrogen spectral lines $H_\alpha$ and $H_\beta$, and FIG. 1B shows emission spectrum intensities of hydrogen spectral lines $H_\gamma$ and $H_\delta$, and of a chlorine spectral line of 833 nm. In addition, scales of the ordinates in FIGS. 1A and 1B are free; however, they are different from each other.

As seen from FIGS. 1A and 1B, each of the emission spectrum intensities of the hydrogen spectral lines $H_\beta$, $H_\gamma$ and $H_\delta$ is linearly decreased as the mixing ratio of $TiCl_4$ is increased, and the decreasing rate of the emission spectrum intensity is rapidly changed (from sharp gradient to moderate gradient) when the mixing ratio of $TiCl_4$ is more than 5 sccm. In other words, when the mixing ratio of $TiCl_4$ is less than 5 sccm, hydrogen atoms and hydrogen radicals present in the plasma in an amount more than that consumed for reduction of $TiCl_4$ and thereby the reduction state of $TiCl_4$ is desirable. On the other hand, when the mixing ratio of $TiCl_4$ is more than 5 sccm, hydrogen atoms and hydrogen radicals in the plasma are almost consumed for reduction of $TiCl_4$ and thereby the reduction state of $TiCl_4$ does not fully proceed.

On the other hand, as shown in FIG. 1B, the emission spectrum intensity of chlorine is linearly increased as the mixing ratio of $TiCl_4$ is increased, and the increasing rate of the emission spectrum intensity of chlorine is rapidly changed when the flow rate of $TiCl_4$ is more than 5 sccm. In other words, when the flow rate of $TiCl_4$ is less than 5 sccm, the reduction reaction of $TiCl_4$ proceeds fully with hydrogen atoms and hydrogen radicals present in the plasma; and when the flow rate of $TiCl_4$ is more than 5 sccm, $TiCl_4$ is excessively present in the plasma in a state not reduced. In addition, it is revealed that hydrogen atoms having a high exciting energy contribute to the reduction reaction of $TiCl_4$ by hydrogen in plasma CVD from the fact that the change in emission spectrum intensity of each of the hydrogen spectral lines $H_\beta$, $H_\gamma$ and $H_\delta$ is in a reversed correlation to the change in the emission spectrum intensity of chlorine.

Figure 2A:
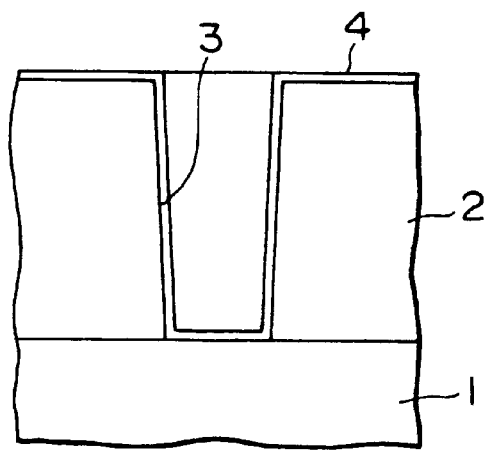
FIGS. 2A to 2D are schematic sectional views showing film formation states of a Ti metal layer depending on changes in flow rate of $TiCl_4$ in the plasma CVD process as the first embodiment of the present invention.
Figure 2B:
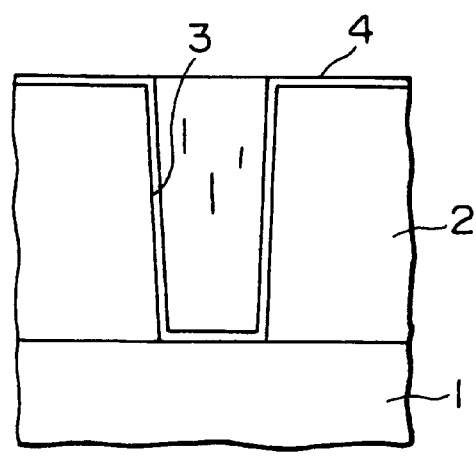
Figure 2C:
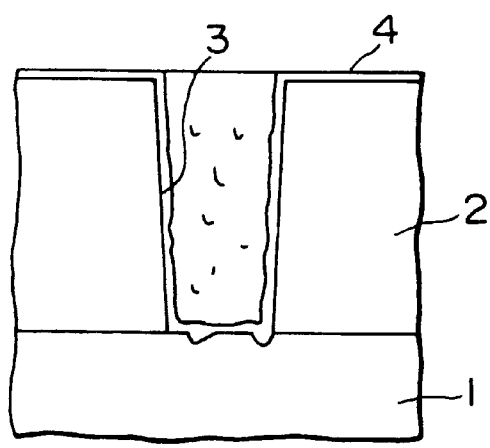
Figure 2D:
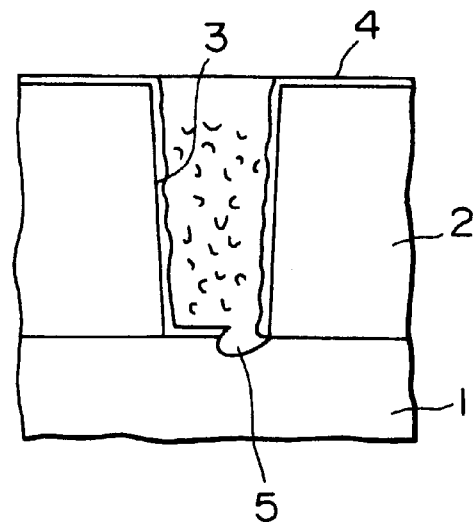

FIGS. 2A to 2D show film formation states of a Ti metal layer 4 at a contact hole 3 portion formed in an interlayer insulating film 2 on a silicon substrate 1 by plasma CVD in a plasma CVD condition in which the mixing ratio of $TiCl_4$ is increased, wherein FIG. 2A shows the case of the flow rate of $TiCl_4$ being 3 sccm, FIG. 2B shows the case of 5 sccm, FIG. 2C shows the case of 10 sccm, and FIG. 2D shows the case of 30 sccm. The analysis for the content of chlorine in the Ti metal film 4 shows that it is 1 atomic % or less when the mixing ratio of $TiCl_4$ is 5 sccm or less. Moreover, when the mixing ratio of $TiCl_4$ is 5 sccm or less, the surface morphology of the Ti metal layer is smooth and any corrosion does not occur on the underlying silicon substrate 1.

However, as shown in FIGS. 2C and 2D, when the mixing ratio of $TiCl_4$ is more than 5 sccm, the content of chlorine in the Ti metal layer is more than 1 atomic %, and the surface morphology of the Ti metal layer is roughened and a corrosion portion 5 is produced on the underlying silicon substrate 1.

Accordingly, to fully proceed the reduction reaction of $TiCl_4$ such that the residual amount of chlorine in the Ti metal layer is 1 atomic % or less, a desirable surface morphology is obtained, and any corrosion does not occur on an underlying silicon substrate, the mixing ratio of $TiCl_4$ may be 5 sccm or less, preferably, 3 sccm or less in the case where the flow rate of hydrogen is kept at 100 sccm. This means that the mixing ratio of $TiCl_4$ may be 5% or less, preferably, 3% or less, on the basis of the flow rate of hydrogen gas.

According to this example, by monitoring the turning point at which the emission spectrum intensity of each hydrogen spectral line or of chlorine is rapidly changed in the case where a metal halide is mixed with hydrogen constituting a source gas, it is possible to form a metal film made from Ti or the like which is small in residual amount of a halogen element and excellent in surface morphology, and which does not allow corrosion of an underlying material layer.

EXAMPLE 2

In this example, in plasma CVD using a mixed gas of $TiCl_4/H_2/Ar$ in which the flow rate of hydrogen is gradually increased with the flow rate of $TiCl_4$ kept constant, an optimum plasma CVD condition, that is, optimum reduction condition is specified by monitoring the decreasing rate of the emission spectrum intensity of a hydrogen spectral line expressed by the following equation, and a Ti metal layer containing chlorine in a small amount and having a desirable surface morphology is formed by plasma CVD in the plasma CVD condition thus obtained.

$$D=(I_0-I)/I_0$$

where $I_0$ indicates an emission spectrum intensity of a hydrogen spectral line before addition of a metal halide, and I indicates an emission spectrum intensity of the hydrogen spectral line after addition of the metal halide.

A plasma CVD system, substrate to be processed, and cleaning step are the same as those in Example 1, and therefore, the overlapped description is not repeated.

A substrate processed in the same manner as in Example 1 is placed on a substrate stage in a plasma CVD system, and is subjected to plasma CVD using a mixed gas of $TiCl_4/H_2/Ar$ to form a Ti metal layer. A plasma CVD condition used in this processing is as follows:

| | |
|---|---|
| $TiCl_4$ | 3 sccm (constant) |
| $H_2$ | 10–100 sccm (variable) |
| $H_2$ + Ar | 270 sccm (constant) |
| gas pressure | 0.35 Pa |
| microwave power | 2.8 Kw (2.45 GHz) |
| stage temperature | 410° C. |

Figure 3A:
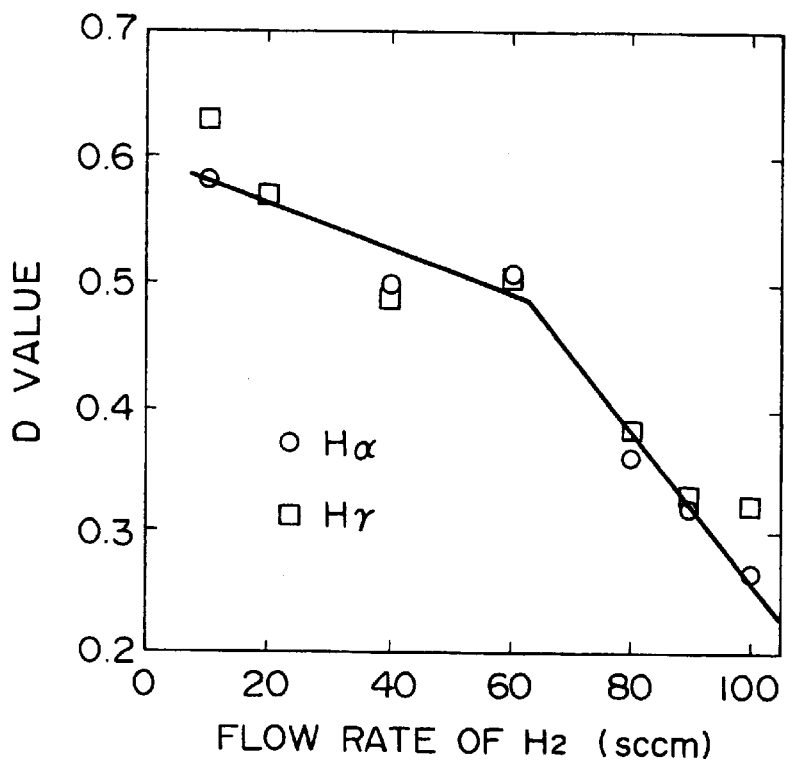
FIGS. 3A and 3B are graphs each showing a relationship between a D value and the flow rate of hydrogen in the plasma CVD process as the first embodiment of the present invention.
Figure 3B:
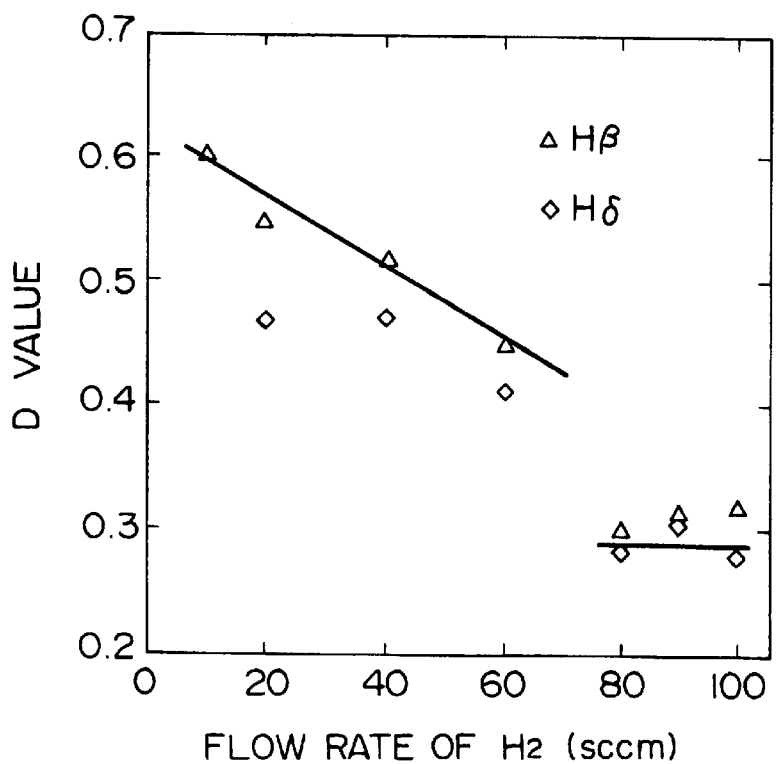

FIGS. 3A and 3B show the decreasing rates D of the emission spectrum intensities of hydrogen spectral lines, depending on the mixing of $TiCl_4$, in the case where the flow rate of hydrogen is gradually increased from 10 sccm to 100 sccm, wherein FIG. 3A shows the decreasing rates of the emission spectrum intensities of the hydrogen spectral lines $H_\alpha$ and $H_\gamma$ and FIG. 3B shows the decreasing rates of the emission spectrum intensities of the hydrogen spectral lines $H_\beta$ and $H_\delta$.

As seen from FIGS. 3A and 3B, the decreasing rate D of the emission spectrum intensity of each hydrogen spectral line is linearly changed as the flow rate of hydrogen is increased; however, when the flow rate of hydrogen is more than 60 sccm, the decreasing rate D is rapidly changed. In other words, when the flow rate of hydrogen is more than the turning point, hydrogen atoms and hydrogen radicals are supplied in an amount more than that consumed for reduction of $TiCl_4$, and consequently, the D value becomes smaller. In particular, as shown in FIG. 3B, the D value of the emission spectrum intensity of each of the hydrogen spectral lines $H_\beta$ and $E_\delta$ at which the exciting energy is large is made constant in a range that the flow rate of hydrogen is more than 60 sccm. This means that the reduction reaction of $TiCl_4$ is not a rate-determining reaction in terms of supply of hydrogen atoms and hydrogen radicals but is a rate-determining reaction on the surface of the substrate, and these radicals having a large exciting energy play an important role for reduction reaction.

Figure 4A:
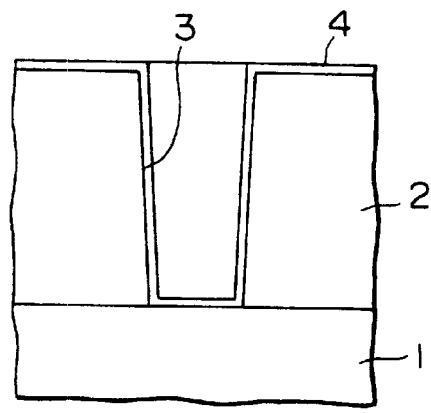
FIGS. 4A to 4E are schematic sectional views showing film formation states of a Ti metal layer depending on changes in flow rate of hydrogen in the plasma CVD process as the first embodiment of the present invention.
Figure 4B:
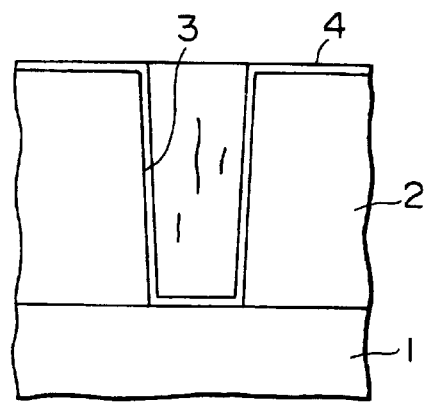
Figure 4C:
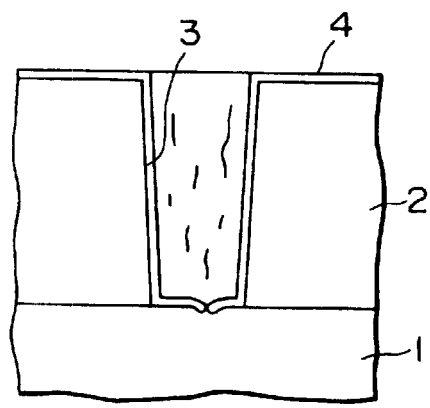
Figure 4D:
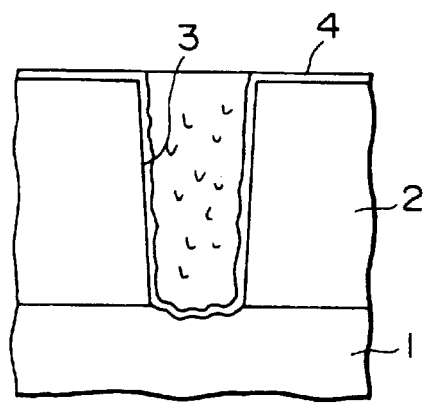
Figure 4E:
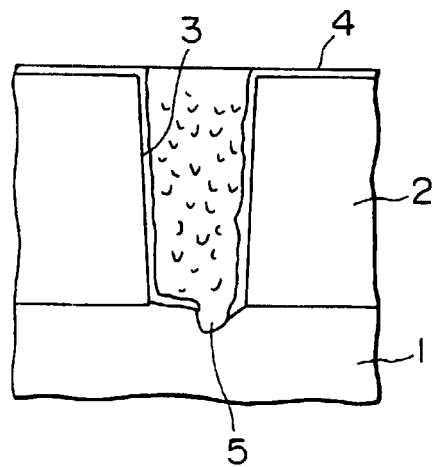
Figure 6:
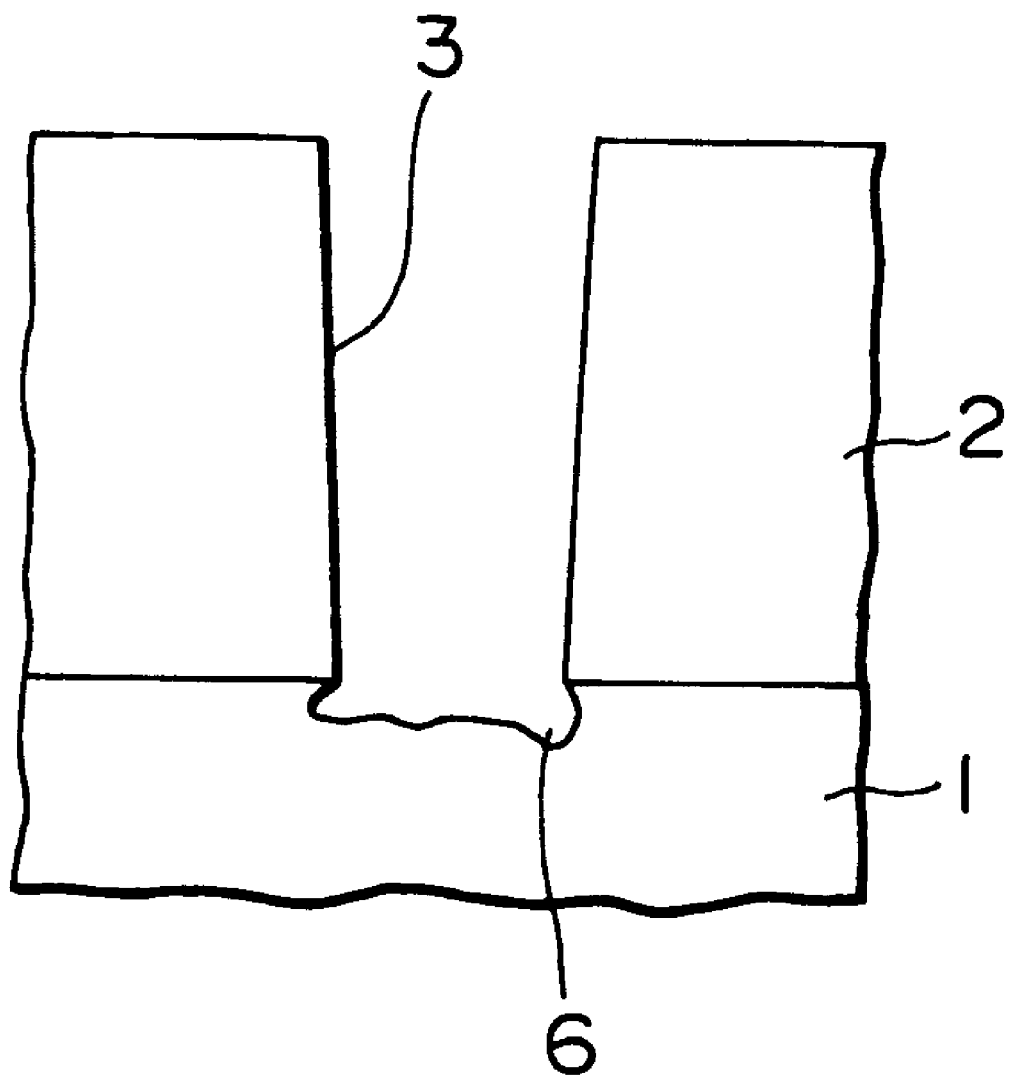
FIG. 6 is a schematic sectional view illustrating a first problem occurring in a related art plasma CVD process.

FIGS. 4A to 4E show film formation states of a Ti metal layer in the vicinity of a contact hole of the substrate depending on the flow rate of hydrogen, under the condition of plasma CVD described above, wherein FIG. 4A shows the case of the flow rate of hydrogen being 100 sccm; FIG. 4B shows the case of 80 sccm; FIG. 4C shows the case of 60 sccm; FIG. 4D shows the case of 10 sccm; and FIG. 4E shows the case of 0 sccm. As seen from these figures, when the flow rate of hydrogen is more than 60 sccm at which the D value is rapidly changed, any corrosion does not occur on an underlying silicon substrate 1 at the bottom portion of the contact hole 3, and a Ti metal layer 4 having a smooth surface morphology is formed. On the contrary, when the flow rate of hydrogen is less than 60 sccm, a corrosion portion 5 is produced on the underlying silicon substrate 1 at the bottom portion of the contact hole 3, and the surface morphology of the Ti metal layer is roughened.

Moreover, when the flow rate of hydrogen is more than 60 sccm at which the D value is rapidly changed, the content of chlorine in the Ti metal layer is one atomic % or less; while when it is less than 60 sccm, the content of chlorine in the Ti metal layer is more than one atomic % or more.

According to this example, by monitoring the turning point at which the D value is rapidly changed in plasma CVD in which a Ti metal layer or the like is formed by reduction of a metal halide such as $TiCl_4$ with hydrogen, it is possible to form the metal film made from Ti which has a smooth surface, does not allow corrosion of an underlying material layer, and contains a halogen element in a small amount.

Embodiment 2

The object of this embodiment is to provide a plasma CVD process using a plasma CVD condition in which hydrogen radicals produced by dissociation of hydrogen molecules are uniformly deposited on the surface of a substrate to be processed. By the use of such a plasma CVD condition, a precursor produced by dissociation of a metal halide easily migrates on the substrate covered with hydrogen radicals, and consequently, nuclei of Ti metal are uniformly grown even on the bottom portion of a contact hole. After that, a Ti metal film is grown on the nuclei of Ti metal uniformly formed, and at the same time the surface of the grown Ti metal film is also uniformly adsorbed or terminated with hydrogen radicals. The precursor produced by dissociation of the metal halide actively migrates even on the surface of the Ti metal film adsorbed or terminated with hydrogen radicals, and the Ti metal film is further uniformly grown. In this way, the Ti metal film having a uniform and smooth surface morphology can be formed.

The termination, by means of hydrogen radicals, of the surface of a substrate to be processed or a Ti metal film which is being grown can be achieved by adopting a plasma CVD condition that the number of hydrogen radicals is more than that of precursor produced by dissociation of a metal halide. More specifically, as the mixing ratio of hydrogen in a mixed gas is gradually increased, the deposition rate of a Ti metal film is gradually increased in a specified range where the mixing ratio of hydrogen is low. This region is the so-called rate-determining region for the supply of hydrogen, and in this region, all of the hydrogen radicals are consumed for reduction of the metal halide and thereby hydrogen radicals contributing to termination of the surface of the substrate become small.

On the other hand, as the mixing ratio of hydrogen is further increased, the deposition rate of a Ti metal film is saturated, that is, it is no longer increased. In this region, hydrogen radicals are present in an amount more than that required for reduction of the metal halide, and the sufficiently remaining hydrogen radicals uniformly terminate the surface of the substrate.

The residual amount of a halogen element in the Ti metal film can be reduced to, for example, one mol % or less by suitably setting the above mixing ratio of hydrogen. In the case where the residual content of the halogen element in the Ti metal film is 1 mol % or less, the discharged amount of the halogen element in the subsequent step becomes extremely small, with a result that any corrosion does not occur on an Al based metal interconnection layer or the like.

The termination, by means of hydrogen radicals, of the surface of the substrate or the Ti metal film which is being grown can be also reinforced by setting a substrate temperature in plasma CVD at 500° C. or less. This embodiment may be applied not only to formation of a metal film in a contact hole reaching a semiconducting substrate made from silicon or the like but also to formation of a metal film on a substrate having a via hole reaching an Al interconnection layer.

By the use of the uniform and smooth metal film thus formed as a contact metal in interlayer connection, it is possible to form a smooth barrier layer such as a TiN film on the metal film without any gap, and hence to provide a semiconductor device with a high reliability.

Figure 13A:
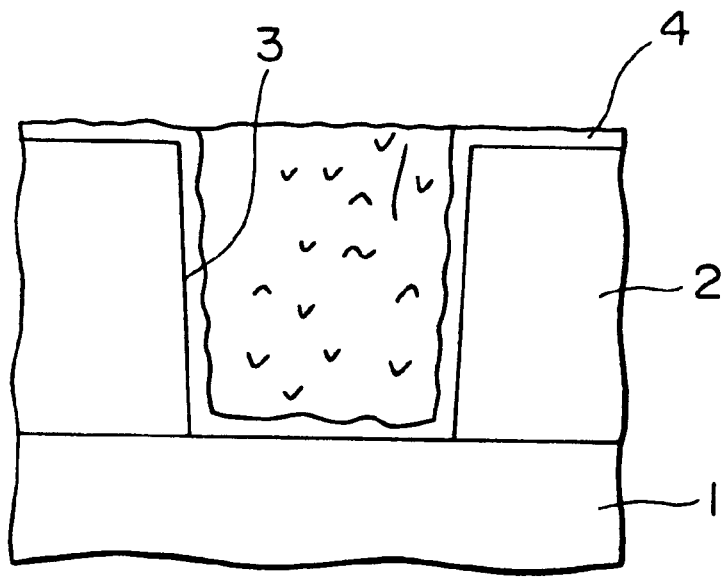
FIGS. 13A and 13B are schematic sectional views showing a second problem occurring in the related art plasma CVD process.
Figure 13B:
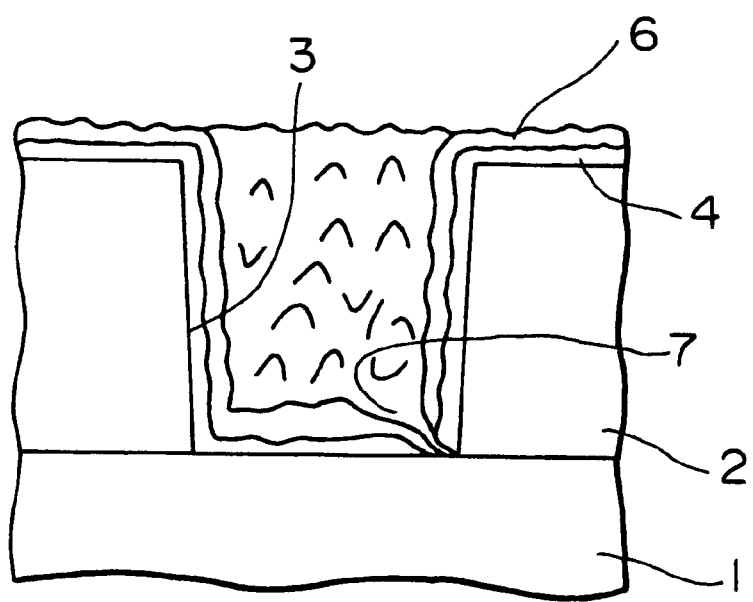

The plasma CVD process in this embodiment will be more clearly understood with reference to the following examples, in which a Ti metal film is formed using a mixed gas of $TiCl_4/H_2/Ar$ by an ECR plasma CVD system. In addition, parts corresponding to those shown in FIGS. 13A and 13B used for description of the related art are indicated by the same characters.

EXAMPLE 1

Figure 7A:
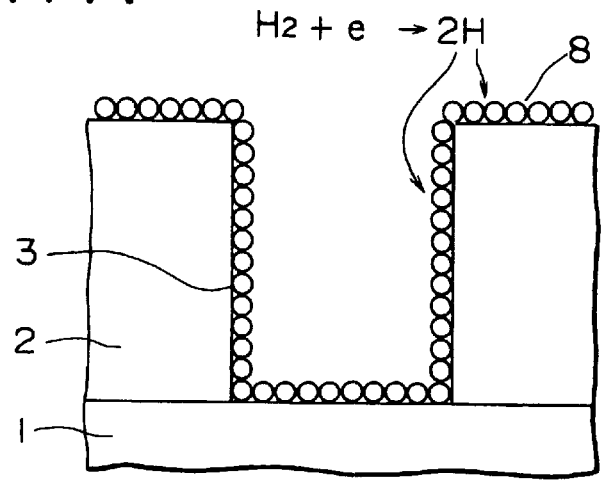
FIGS. 7A to 7C are schematic sectional views illustrating the principal of a plasma CVD process as a second embodiment of the present invention.
Figure 7B:
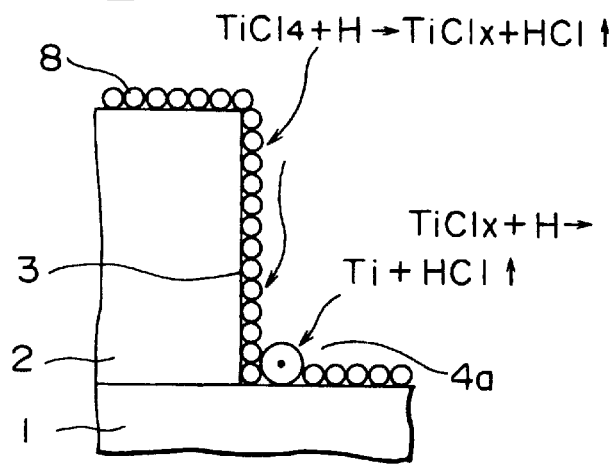
Figure 7C:
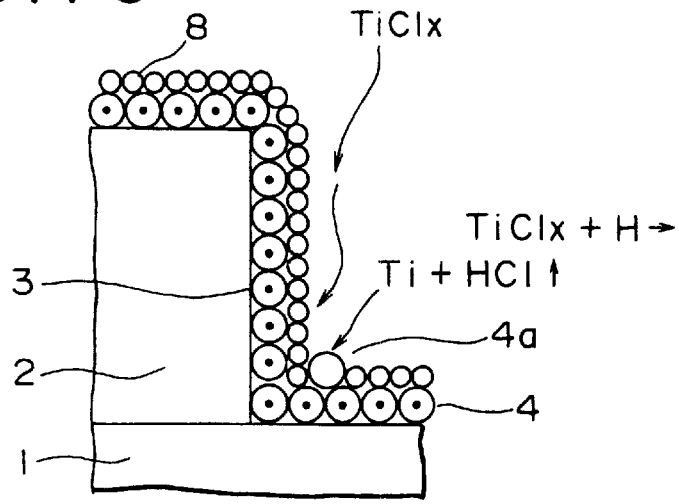

This example for illustrating the principal of this embodiment will be described with reference to FIGS. 7A to 7C.

An interlayer insulating film 2 (made from $SiO_2$) having a thickness of 1.0 $\mu$m is formed on a semiconducting substrate 1 (made from silicon or the like) formed with an impurity diffusion layer (not shown) in a surface portion and is perforated to form a contact hole 3 having an opening diameter of 0.25 $\mu$m. Subsequently, native oxide on the impurity diffusion layer exposed at a bottom portion of the contact hole is removed with diluted hydrofluoric acid solution. The substrate is then placed on a substrate stage in an ECR plasma CVD system, and the bottom portion of the contact hole is first cleaned by plasma processing using a mixed gas of $H_2/Ar$ or $H_2/Ar/N_2$.

A Ti layer is formed in the contact hole of the substrate using a mixed gas of $TiCl_4/H_2/Ar$ in the same ECR plasma CVD system. A plasma CVD condition used in this processing is as follows:

| | |
|---|---|
| $TiCl_4$ | 3 sccm |
| $H_2$ | 100–150 sccm |
| Ar | 20–170 sccm |
| H2 + Ar | 270 sccm |
| gas pressure | 0.4 Pa |
| microwave power | 2.0–2.8 Kw (2.45 GHz) |
| stage temperature | 380–460° C. |

The above plasma CVD condition is set such that a flow rate of hydrogen in a mixed gas is relatively large, and accordingly hydrogen radicals produced by dissociation of hydrogen in a plasma terminate the entire surface of the substrate to be processed, that is, the surface of the interlayer insulating film 2, a side surface of the contact hole 3, and the surface of the semiconducting substrate 1 exposed at the bottom portion of the contact hole 3. This state is shown in FIG. 7A, in which the surface of the substrate to be processed is uniformly terminated with hydrogen radicals 8.

Next, a precursor in the form of $TiCl_x$ (x is an integer less than 4) produced by excitation of $TiCl_4$ in the plasma or reduction of TiCl$_4$ by hydrogen radicals reaches the surface of the substrate. In this step, since the surface of the substrate is already terminated with the hydrogen radicals 8, TiCl$_x$ actively migrates on the surface of the substrate. Consequently, as shown in FIG. 7B, nuclei 4a of Ti metal are uniformly formed even on the bottom portion of the contact hole 3.

After that, a Ti metal film 4 is uniformly grown on the nuclei 4a of Ti metal thus uniformly formed. Even in this step, the surface of the Ti metal film 4 is uniformly adsorbed or terminated with the hydrogen radicals 8. The precursor easily migrates even on the surface of the Ti metal film 4 and is thus uniformly adsorbed or terminated with the hydrogen radicals 8, and subsequently the nuclei 4a of the Ti metal are uniformly formed as shown in FIG. 7C. The Ti metal film 4 is then uniformly formed to a desired thickness while keeping a desirable surface morphology.

In this example, a uniform and smooth metal film made from Ti can be formed by plasma CVD using the plasma CVD condition specified by the present invention, and a TiN film can be uniformly and smoothly formed thereon without generation of particles of metal or gaps, with a result that a high reliability semiconductor device can be fabricated.

EXAMPLE 2

This example will be described with reference to FIG. 8, FIGS. 9A and 9B, and FIGS. 10A to 10E, wherein a metal film is formed by plasma CVD using a mixed gas in which a mixing ratio of hydrogen in the mixed gas is gradually increased.

A substrate to be processed and pre-treatment used in this example are the same as those in Example 1, and therefore, the overlapping explanation is not repeated.

A substrate processed in the same manner as in Example 1 is set on a substrate stage in a substrate biasing type ECR plasma etching system, and a Ti metal layer is formed by plasma CVD using a mixed gas of TiCl$_4$/H$_2$/Ar in the following plasma CVD condition:

| | |
|---|---|
| TiCl$_4$ | 3 sccm (constant) |
| H$_2$ | 0–180 sccm (variable) |
| H$_2$ + Ar | 270 sccm (constant) |
| gas pressure | 0.4 Pa |
| microwave power | 2.8 Kw (2.45 GHz) |
| stage temperature | 460° C. |

FIG. 8 shows a deposition rate of a Ti metal film by plasma CVD in the above plasma CVD condition in which a flow rate of hydrogen is gradually increased. In this case, the flow rate of Ar is gradually decreased with the total flow rate of (H$_2$+Ar) being kept constant. As seen from this graph, the deposition rate of the Ti metal film is substantially saturated for the flow rate of H$_2$ in a range of from 80 to 100 sccm. When the flow rate of hydrogen is less than the above range, hydrogen radicals in a plasma are immediately consumed for reduction of TiCl$_4$ and thereby they are usually lacking. Accordingly, the surface of the substrate is not uniformly terminated with the hydrogen radicals.

On the other hand, the deposition rate of Ti metal film is not saturated yet for the flow rate of hydrogen of about 80 sccm. In this region, hydrogen radicals sufficiently remain after in the plasma being consumed for reduction of TiCl$_4$, and consequently the surface of the substrate are uniformly with the residual hydrogen radicals. The surface of the Ti metal film which is being formed on the substrate is similarly adsorbed or terminated with the residual hydrogen radicals.

The state in which the surface of the substrate is uniformly terminated with hydrogen radicals can be detected by monitoring the change of emission spectrum intensities of a plasma. Specifically, when a specified amount of TiCl$_4$ is mixed with hydrogen constituting a source gas of plasma CVD in a plasma, the emission spectrum intensity of each hydrogen spectral line is decreased, and the decreasing rate D of the emission spectrum intensity of the hydrogen spectral line is rapidly changed at a certain point, the decreasing rate D being expressed by the following equation:

$$D = (I_0 - I)/I_0$$

where I$_0$ indicates an emission spectrum intensity of the hydrogen spectral line before addition of a metal halide and I indicates an emission spectrum intensity of the hydrogen spectral line after addition of a metal halide.

The above turning point at which the decreasing rate D is rapidly changed is used to decide the uniform termination of the surface of the substrate with hydrogen radicals.

Figure 9A:
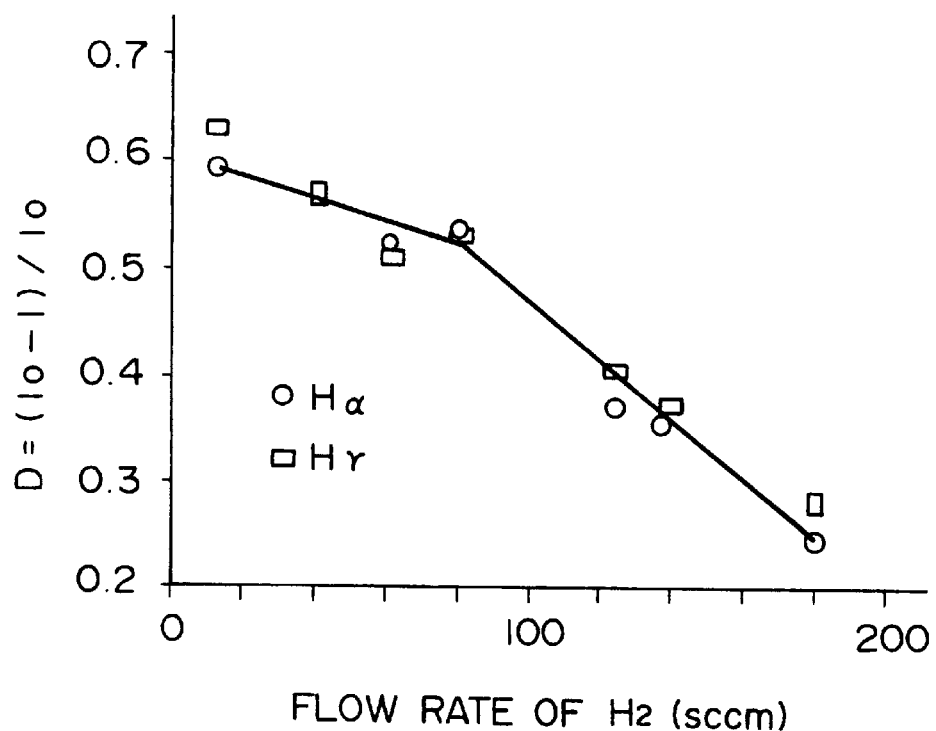
FIGS. 9A and 9B are graphs each showing a relationship between a flow rate of hydrogen and a decreasing rate D of an emission spectrum intensity of each hydrogen spectral line in Example 2 according to the second embodiment.
Figure 9B:
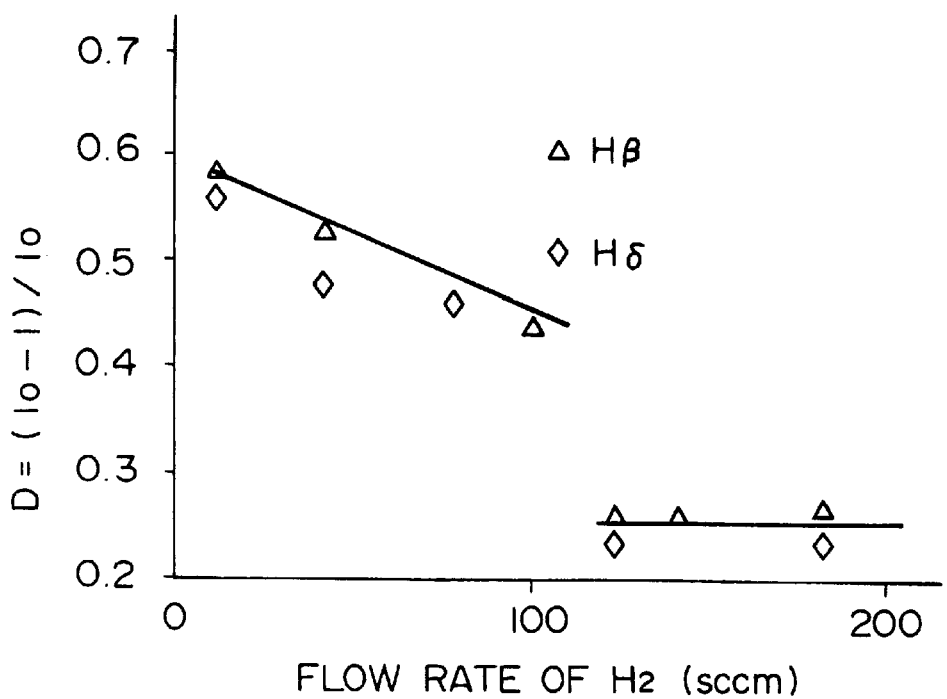

FIGS. 9A and 9B show the decreasing rates D of the emission spectrum intensities of hydrogen spectral lines, depending on the mixing of TiCl$_4$, in the case where the flow rate of hydrogen is gradually increased from 10 sccm to 180 sccm, wherein FIG. 9A shows the decreasing rates of the emission spectrum intensities of hydrogen spectral lines H$_\alpha$ (656.3 nm) and H$_\gamma$ (434.0 nm) and FIG. 9B shows the decreasing rates of the emission spectrum intensities of hydrogen spectral lines H$_\beta$ (486.1 nm) and H$_\delta$ (410.2 nm). In addition, the plasma CVD condition is the same as described in this example.

As seen from FIGS. 9A and 9B, the decreasing rate D of the emission spectrum intensity of each hydrogen spectral line is linearly changed as the flow rate of hydrogen is increased; however, when the flow rate of hydrogen is more than a range of 80 to 100 sccm, the decreasing rate D is rapidly changed. In other words, when the flow rate of hydrogen is more than the turning point, hydrogen atoms and hydrogen radicals are present in an amount more than that consumed for reduction of TiCl$_4$, and consequently, the surface of the substrate is uniformly terminated with the sufficiently remaining hydrogen radicals. In this range, the D value is small. In particular, as shown in FIG. 9B, the D value of the emission spectrum intensity of each of the hydrogen spectral lines H$_\beta$ and H$_\delta$ at which the exciting energy is large is made substantially constant when the flow rate of hydrogen is more than 100 sccm. This means that the reduction reaction of TiCl$_4$ is not a rate-determining reaction the supply of hydrogen atoms and hydrogen radicals but is a rate-determining reaction on the surface of the substrate, and these radicals having a large excitation energy play an important role in the reduction reaction.

Figure 10A:
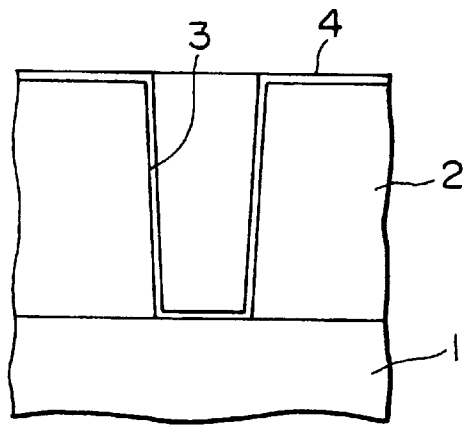
FIGS. 10A to 10E are schematic sectional views showing film formation states of a metal film in the vicinity of a contact hole of a substrate to be process in Example 2 according to the second embodiment.
Figure 10B:
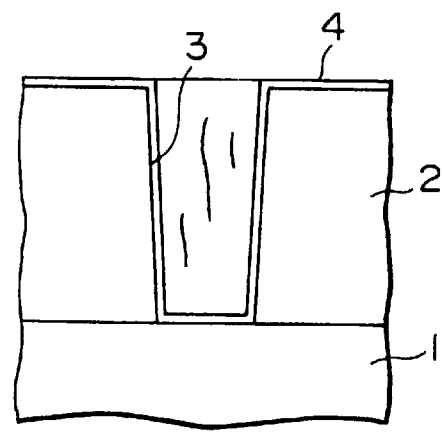
Figure 10C:
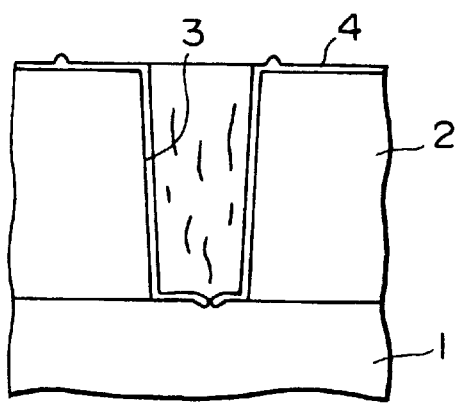
Figure 10D:
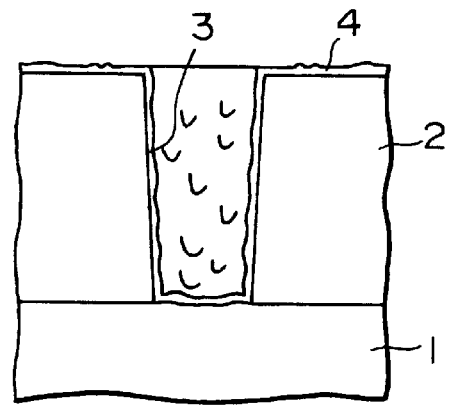
Figure 10E:
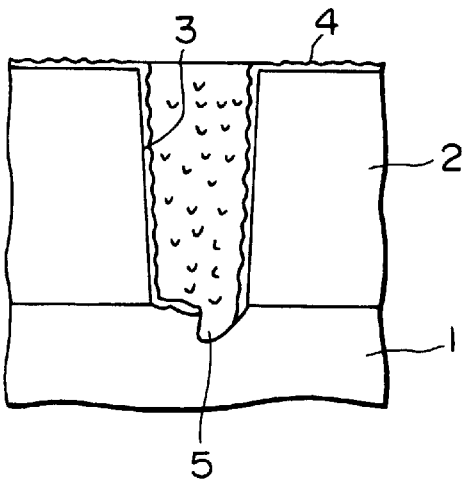

FIGS. 10A to 10E show film formation states of a Ti metal layer in the vicinity of a contact hole of the substrate in the case where the flow rate of hydrogen is gradually increased from 0 sccm to 100 sccm, wherein FIG. 10A shows the case of the flow rate of hydrogen being 100 sccm; FIG. 10B is the case of 80 sccm; FIG. 10C is the case of 60 sccm; FIG. 10D is the case of 10 sccm; and FIG. 10E is the case of 0 sccm.

As seen from these figures, in the case where the flow rate of hydrogen is 100 sccm, a Ti metal film 4 having a smooth surface is uniformly formed not only on an interlayer insulating film 2 but also in the contact hole 3 (see FIG. 10A). The same is true for the substrate by plasma CVD using the plasma CVD condition in which the flow rate of hydrogen is more than 100 sccm.

Even for the substrate shown in FIG. 10B in which the flow rate of hydrogen is 80 sccm, although the surface of the Ti metal film 4 is only slightly roughened, the Ti metal film is capable of functioning as a high reliability contact metal. The substrates shown in FIGS. 10A and 10B are processed in the plasma CVD condition in which the deposition rate of the Ti metal film is substantially saturated as shown in the graph of FIG. 8, so that the surface of the substrate or the surface of the Ti metal film which is being formed is uniformly terminated or adsorbed with hydrogen radicals. In addition, the Ti metal layer 4 thus formed in the above plasma CVD condition contains chlorine in an amount of 1 mol % or less.

On the other hand, in the case where the flow rate of hydrogen is 60 sccm or less, the supply of hydrogen radicals is not sufficient. Accordingly, the surface of the substrate is not uniformly terminated with hydrogen radicals, and part or all of the surface of the substrate is left as exposed. In this case, the migration of the precursor composed of TiClx becomes slow, and thereby the nuclei of the Ti metal are not uniformly formed. Thus, since the Ti metal film 4 is grown around the non-uniform nuclei of Ti metal, the Ti metal film 4 is formed in the shape of particles, thus making poor the surface morphology (see FIGS. 10C to 10E). Moreover, the reduction reaction of $TiCl_4$ by hydrogen radicals does not fully proceed, and accordingly a portion, exposed at the contact hole, of the semiconducting substrate 1 made from silicon is etched, to produce a corrosion portion 5. This plasma CVD condition is that at the time before the deposition rate of the Ti metal film shown in the graph of FIG. 8 is substantially saturated, so that the surface of the substrate or the surface of the Ti metal film which is being formed is not uniformly terminated or adsorbed with hydrogen radicals. Moreover, the Ti metal film 4 thus formed in this plasma CVD condition contains chlorine in an amount of 1 mol % or more.

According to this example, the optimum mixing ratio of hydrogen in a mixed gas can be specified, and thereby a metal layer having a smooth surface morphology and containing chlorine in a small amount can be formed by plasma CVD. In addition, the optimum mixing ratio of hydrogen in the mixed gas is affected by the factors of the plasma CVD system, and thereby it is unreasonable to specify the plasma CVD condition by the mixing ratio not associated with the factors of the plasma CVD system. As a result, to fabricate a high reliability metal film and a semiconductor device having such a metal film, it becomes important to adopt the plasma CVD condition in a saturated region of the deposition rate on the basis of the relationship between the flow rate of hydrogen and the deposition rate shown in FIG. 9, the relationship being measured for the plasma CVD system used for formation of the metal film by plasma CVD.

EXAMPLE 3

In this example described with reference to FIGS. 11A to 11D and FIGS. 12A and 12B, a metal film is formed by plasma CVD in a plasma CVD condition in which the flow rate of a metal halide is changed with the flow rate of hydrogen kept constant, differently from Example 2.

The substrate to be processed and the pre-treatment in this example are the same as those in Example 1, and therefore, the overlapping description is not repeated.

The substrate processed in the same manner as in Example 1 is placed on a substrate stage in a substrate biasing type ECR plasma etching system, and a Ti metal layer is formed using a mixed gas of $TiCl_4/H_2/Ar$ by plasma CVD. A plasma CVD condition used in this processing is as follows:

| | |
|---|---|
| $TiCl_4$ | 3–30 sccm (variable) |
| $H_2$ | 100 sccm (constant) |
| Ar | 170 sccm (constant) |
| gas pressure | 0.4 Pa |
| microwave power | 2.8 Kw (2.45 GHz) |
| stage temperature | 460° C. |

Figure 11A:
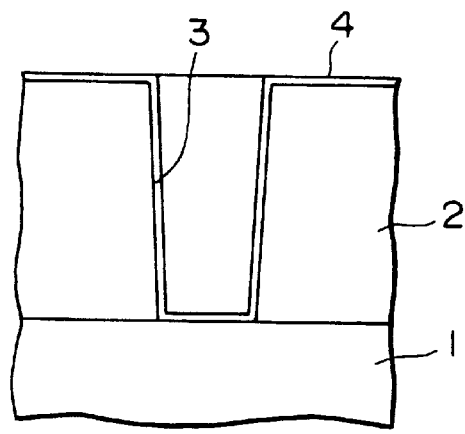
FIGS. 11A to 11D are schematic sectional views showing film formation states of a metal film in the vicinity of a contact hole of a substrate to be process in Example 3 according to the second embodiment.
Figure 11B:
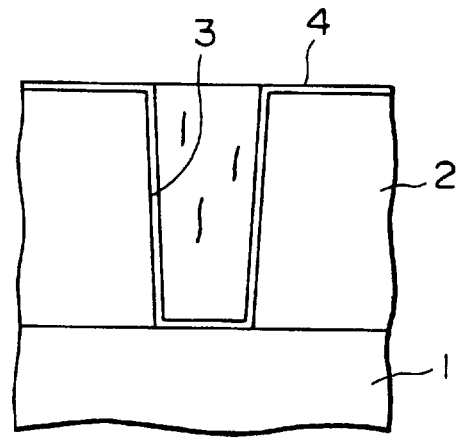
Figure 11C:
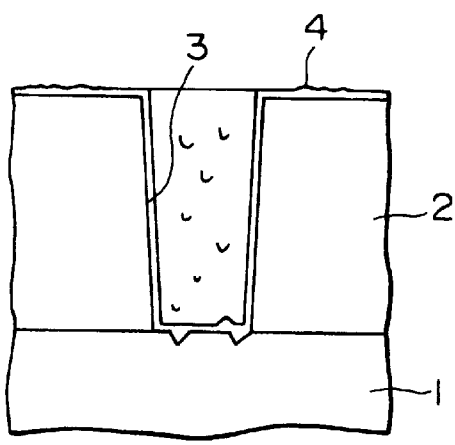
Figure 11D:
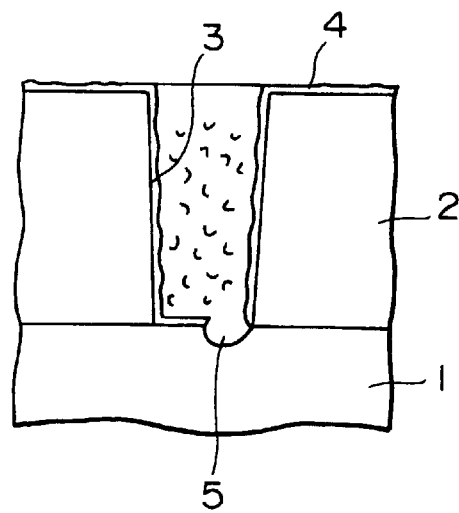

FIGS. 11A to 11D show film formation states of a Ti metal layer 4 in the vicinity of a contact hole 3 of a substrate in a plasma CVD condition in which the mixing ratio of $TiCl_4$ is increased from 3 sccm to 30 sccm, wherein FIG. 11A shows the case of the flow rate of $TiCl_4$ being 3 sccm; FIG. 11B shows the case of 5 sccm; FIG. 11C shows the case of 10 sccm, and FIG. 11D shows the case of 30 sccm.

As seem from these figures, in the case where the flow rate of $TiCl_4$ is 3 sccm, the Ti metal film 4 having an extremely smooth surface is uniformly formed not only on an interlayer insulating film 2 but also in the contact hole 3 (see FIG. 11A). Even in the case where the flow rate of $TiCl_4$ is 5 sccm, although the surface of the Ti metal film 4 is only slightly roughened, the Ti metal film is capable of functioning as a high reliability contact metal (see FIG. 11B).

In each of these plasma CVD conditions, the surface of the substrate or the surface of the Ti metal film which is being formed is uniformly terminated or adsorbed with hydrogen radicals. The Ti metal layer 4 thus formed in the above plasma CVD condition contains chlorine in an amount of 1 mol % or less.

On the other hand, in the case where the flow rate of $TiCl_4$ is 10 sccm or more, the supply of hydrogen radicals is not sufficient. Accordingly, the surface of the substrate is not uniformly terminated with hydrogen radicals, and part or all of the surface of the substrate is left as exposed. In this case, the migration of the precursor composed of TiClx becomes slow, and thereby the nuclei of the Ti metal are not uniformly formed. Thus, since the Ti metal film 4 is grown around the non-uniform nuclei of Ti metal, the Ti metal film 4 is formed in the shape of particles, thus making poor the surface morphology (see FIGS. 11C to 11D). Moreover, the reduction reaction of $TiCl_4$ by hydrogen radicals does not fully proceed, and accordingly a portion, exposed at the bottom portion of the contact hole, of the semiconducting substrate 1 made from silicon is etched, to produce a corrosion portion 5. In these plasma CVD conditions, the surface of the substrate or the surface of the Ti metal film is not uniformly terminated or adsorbed with hydrogen radicals. Moreover, the Ti metal film 4 thus formed in the above plasma CVD condition contains chlorine in an amount of 1 mol % or less.

Even in this example, the uniform termination of the surface of a substrate with hydrogen radicals can be detected by monitoring the emission spectrum intensities of a plasma. This will be described with reference to FIG. 12A and 12B.

Figure 12A:
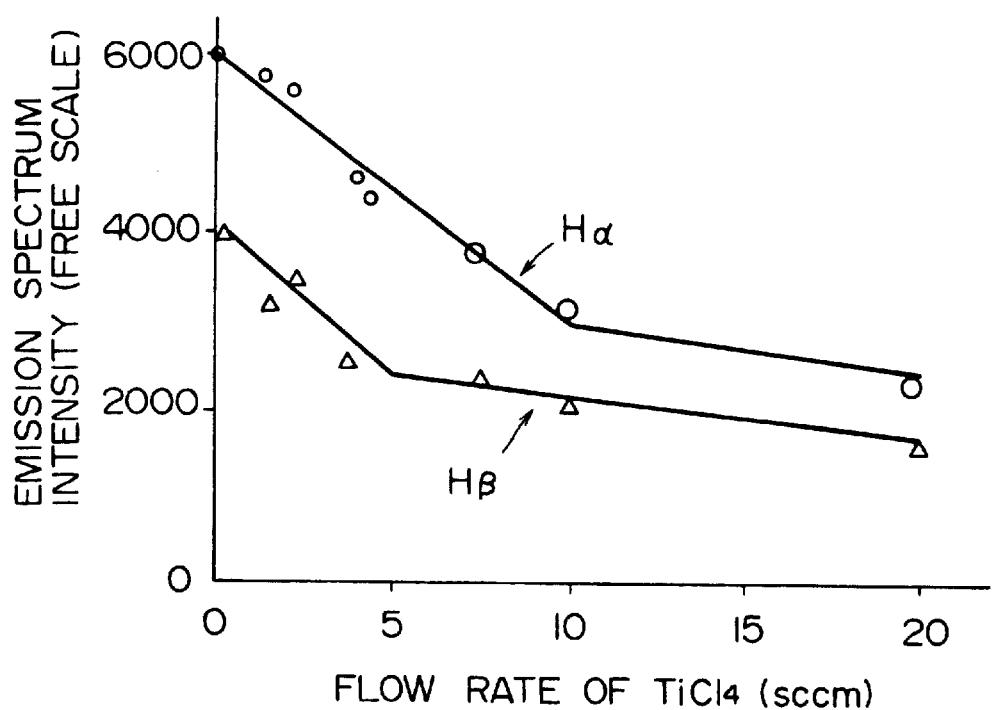
FIGS. 12A and 12B are graphs each showing a relationship between a flow rate of $TiCl_4$ and an emission spectrum intensity of each hydrogen spectral line.
Figure 12B:
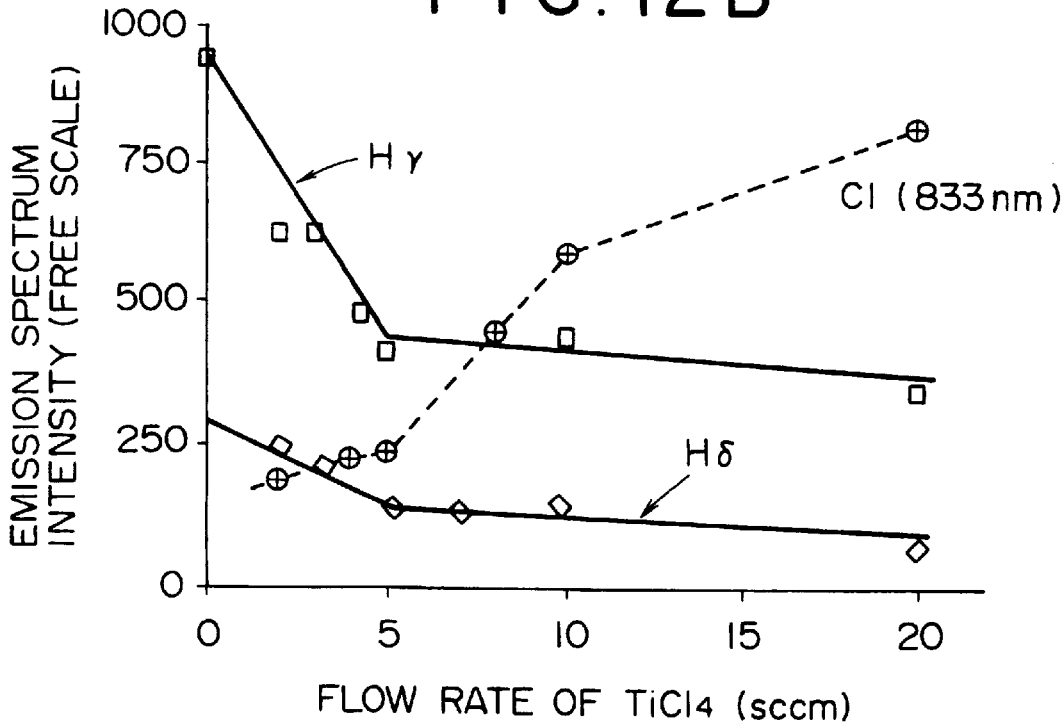

FIGS. 12A and 12B show emission spectrum intensities of hydrogen atoms and chlorine in a plasma produced by plasma CVD using the mixed gas of $TiCl_4/H_2/Ar$ in which the flow rate of $TiCl_4$ is gradually increased from 0 sccm to 20 sccm, wherein FIG. 12A shows emission spectrum intensities of hydrogen spectral lines $H_\alpha$ and $H_\beta$, and FIG. 12B shows emission spectrum intensities of hydrogen spectral lines $H_\gamma$ and $H_\delta$, and of a chlorine spectral line of 833 nm. In addition, scales of the ordinates in FIGS. 12A and 12B are free; however, they are different from each other. In addition, the plasma CVD condition is the same as described in this example.

As seen from FIGS. 1A and 1B, each of the emission spectrum intensities of hydrogen spectral lines $H_\beta$, $H_\gamma$ and $H_\delta$ is linearly decreased as the mixing ratio of $TiCl_4$ is increased, and the decreasing rate of the emission spectrum intensity is rapidly changed (from sharp gradient to moderate gradient) when the mixing ratio of $TiCl_4$ is more than about 5 sccm. In other words, when the mixing ratio of $TiCl_4$ is less than about 5 sccm, hydrogen atoms and hydrogen radicals are present in the plasma in an amount more than that consumed for reduction of $TiCl_4$, with the result that the surface of the substrate is uniformly terminated with hydrogen radicals. On the other hand, when the mixing ratio of $TiCl_4$ is more than 5 sccm, hydrogen atoms and hydrogen radicals in the plasma are almost consumed for reduction of $TiCl_4$ and are usually in a lacking state, with a result that the surface of the substrate is not uniformly terminated with hydrogen radicals.

On the other hand, as shown in FIG. 12B, the emission spectrum intensity of chlorine is linearly increased as the mixing ratio of $TiCl_4$ is increased, and the increasing rate of the emission spectrum intensity of chlorine is rapidly changed when the flow rate of $TiCl_4$ is more than about 5 sccm. In other words, when the flow rate of $TiCl_4$ is less than about 5 sccm, the reduction reaction of $TiCl_4$ is fully completed with hydrogen atoms and hydrogen radicals present in the plasma; and when the flow rate of $TiCl_4$ is more than 5 sccm, $TiCl_4$ is excessively present in the plasma and not reduced. In addition, it is revealed that hydrogen atoms having a high excitation energy contribute to the reduction reaction of $TiCl_4$ in plasma CVD from the fact that the change in emission spectrum intensity of each of the hydrogen spectral lines $H_\beta$, $H_\gamma$ and $H_\delta$ is in a reversed correlation to the change in the emission spectrum intensity of chlorine.

Even in this example, it is possible to obtain the optimum plasma CVD condition, that is, the optimum mixing ratio of hydrogen to a metal halide, and hence to form a metal film having a smooth surface morphology and containing chlorine in a small amount by plasma CVD in the plasma CVD condition.

Although the plasma CVD process of the present invention and a semiconductor device having a metal film formed by the plasma CVD process have been described with reference to the embodiments, such description is for illustrative purposes only, and it is to be understood that many changes and variations may be made without departing from the spirit and scope of the invention. For example, although $TiCl_4$ is used as the metal halide in the embodiments, the above-described various titanium halides may be used in the present invention. Moreover, the technical thought of the present invention can be applied to formation of metal films made from other metal halides.

Although a silicon substrate having a contact hole reaching a diffusion layer is used as a substrate on which a metal film is to be formed, a semiconducting substrate having a via hole reaching an interconnection layer such as an Al based metal interconnection, a poly-Si and further other member to be processed may be used.

Although the ECR plasma CVD system is used in the embodiments, various systems such as a parallel plate type plasma CVD system, helicon type plasma CVD system, ICP (inductively coupled plasma) CVD system, and TCP (transformer coupled plasma) system may be used. Moreover, the reduction of a metal halide can be more effectively achieved by adopting light-plasma CVD in which an exciting light beam is emitted with generation of a plasma, such as a low pressure Hg lamp or eximer laser.

What is claimed is:

1. A plasma CVD method for forming a metal film on a substrate using a plasma made from a mixed gas comprising a mixture of a metal halide and hydrogen, said method comprising:

taking an emission spectrum of said plasma of said mixed gas; and adjusting a ratio of said metal halide and hydrogen in said mixed gas based on said emission spectrum.

2. A plasma CVD method according to claim 1, wherein said step of adjusting further comprises monitoring an emission spectrum intensity of a hydrogen spectral line for at least one of $H_\beta$, $H_\gamma$, and $H_\delta$.

3. A plasma CVD method according to claim 1, further comprising forming said metal film at a substrate temperature of 500° C. or less.

4. A plasma CVD method according to claim 1, further comprising forming said metal film such that said metal film formed on said substrate contains halogen atoms in an amount of one atomic % or less.

5. A plasma CVD method according to claim 1, wherein $$D=(I_0-I)/I_0$$

where $I_0$ indicates an emission spectrum intensity of a hydrogen spectral line in said emission spectrum before addition of said metal halide to said mixture, and I indicates an emission spectrum intensity of the hydrogen spectral line after addition of said metal halide to said mixture, said step of adjusting further comprising increasing an amount of hydrogen in said mixture until D experiences a non-linear change.

6. A plasma CVD method according to claim 5, further comprising forming said metal film at a substrate temperature of 500° C. or less.

7. A plasma CVD method according to claim 5, further comprising forming said metal film such that said metal film formed on said substrate contains halogen atoms in an amount of one atomic % or less.

8. A plasma CVD method according to claim 1, further comprising increasing an amount of said metal halide in said mixture until said emission spectrum shows a non-linear change in emission intensity from hydrogen in said plasma.

9. A plasma CVD method according to claim 1, further comprising increasing an amount of said metal halide in said mixture until said emission spectrum shows a non-linear change in emission intensity from a halide of said metal halide in said plasma.

10. A plasma CVD method according to claim 5, further comprising providing hydrogen in said mixture in at least an amount at which D experiences a non-linear change.

11. A semiconductor device having a metal film which is formed on a substrate using said plasma CVD method according to claim 1.

12. A plasma CVD method according to claim 1, wherein said step of adjusting further comprises providing hydrogen in said mixture in a sufficient quantity such that when said plasma is formed, hydrogen radicals are formed from said hydrogen insufficient quantity such that a surface of said substrate is uniformly terminated with said hydrogen radicals prior to formation of said metal film.

13. A plasma CVD method according to claim 1, wherein said step of adjusting further comprises providing hydrogen in said mixture in a sufficient quantity such that when said plasma is formed, hydrogen radicals are formed from said hydrogen in sufficient quantity such that a surface of said metal film is uniformly terminated with said hydrogen radicals as said metal film is formed.

* * * * *